(12) United States Patent
Ji et al.

(10) Patent No.: US 10,415,639 B2
(45) Date of Patent: Sep. 17, 2019

(54) ADJUSTABLE MAGNETIC BUOYANCY GRAVITY COMPENSATOR

(71) Applicant: SHANGHAI MICRO ELECTRONICS EQUIPMENT (GROUP) CO., LTD., Shanghai (CN)

(72) Inventors: Hanchuan Ji, Shanghai (CN); Qingsheng Chen, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/553,724

(22) PCT Filed: Feb. 24, 2016

(86) PCT No.: PCT/CN2016/074395
§ 371 (c)(1),
(2) Date: Aug. 25, 2017

(87) PCT Pub. No.: WO2016/134652
PCT Pub. Date: Sep. 1, 2016

(65) Prior Publication Data
US 2018/0010633 A1  Jan. 11, 2018

(30) Foreign Application Priority Data
Feb. 28, 2015 (CN) .......................... 2015 1 0091980

(51) Int. Cl.
*G03F 7/20* (2006.01)
*F16C 29/02* (2006.01)
(Continued)

(52) U.S. Cl.
CPC ........ *F16C 29/025* (2013.01); *F16C 32/0603* (2013.01); *G03F 7/70758* (2013.01);
(Continued)

(58) Field of Classification Search
CPC ......... G03F 7/20; G03F 7/70816; H02K 1/27; H02K 33/18; H02K 41/031; F16C 29/025; F16C 32/0603
See application file for complete search history.

(56) References Cited

U.S. PATENT DOCUMENTS 5,216,308 A * 6/1993 Meeks ................ F16C 32/0459
310/90.5
6,040,675 A * 3/2000 Ono ........................ B23Q 15/22
318/649
(Continued)

FOREIGN PATENT DOCUMENTS

CN        1442755 A       9/2003
CN      102200689 A       9/2011
(Continued)

*Primary Examiner* — Deoram Persaud
(74) *Attorney, Agent, or Firm* — Muncy, Geissler, Olds & Lowe, P.C.

(57) ABSTRACT

A magnetic gravity compensator comprises a stator (1), a rotor (2), a base (4) and an adjustment mechanism (6). The stator (1) is disposed on the base (4), and the rotor (2) is levitated with respect to the stator (1). The stator (1) comprises a central cylindrical magnet (11) that is fixed to the base (4) by the adjustment mechanism (6) and consists of at least two arc magnets (111). The adjustment mechanism (6) has a first end fixed to the base (4) and a second end securely connected to the at least two arc magnets (111). The adjustment mechanism (6) is configured to drive the at least two arc magnets (111) to synchronously move radially with respect to a central axis of the central cylindrical magnet (11) so as to change a magnetic circuit between the central cylindrical magnet (11) and the rotor (2), and thereby adjust a magnetic levitation force between the stator (1) and the rotor (2).

11 Claims, 6 Drawing Sheets

(51) Int. Cl.
*H02K 33/18* (2006.01)
*F16C 32/06* (2006.01)
*H02K 1/27* (2006.01)
*H02K 41/03* (2006.01)

(52) U.S. Cl.
CPC ........... *G03F 7/70816* (2013.01); *H02K 1/27* (2013.01); *H02K 33/18* (2013.01); *H02K 41/031* (2013.01)

(56) References Cited

U.S. PATENT DOCUMENTS

| | | | |
|---|---|---|---|
| 2001/0013734 A1* | 8/2001 | Kanebako | F16C 32/0493 310/90.5 |
| 2005/0146698 A1* | 7/2005 | Hol | G03F 7/70758 355/53 |
| 2006/0139617 A1 | 6/2006 | Dams | |
| 2006/0279141 A1 | 12/2006 | De Weerdt et al. | |
| 2008/0092672 A1 | 4/2008 | Gibson et al. | |
| 2011/0050006 A1* | 3/2011 | Huang | H01F 7/066 310/12.15 |
| 2014/0340666 A1* | 11/2014 | Butler | G03F 7/704 355/72 |
| 2014/0346909 A1* | 11/2014 | Vogler | G03F 7/70766 310/105 |
| 2015/0212430 A1* | 7/2015 | Boon | G03F 7/70758 355/72 |
| 2015/0236621 A1* | 8/2015 | Van Lievenoogen | H02N 15/00 310/90.5 |

FOREIGN PATENT DOCUMENTS

| | | |
|---|---|---|
| CN | 102866596 A | 1/2013 |
| CN | 102944980 A | 2/2013 |
| CN | 103048891 A | 4/2013 |
| CN | 103293860 A | 9/2013 |
| CN | 103034065 B | 12/2014 |
| JP | 2000201471 A | 7/2000 |
| JP | 2006040927 A | 2/2006 |
| JP | 2008043247 A | 2/2008 |
| JP | 2014507786 A | 3/2014 |
| KR | 1020090088695 | 8/2009 |
| TW | 200729673 A | 8/2007 |
| WO | WO 20006007167 A2 | 1/2006 |
| WO | wo 2015001689 a1 | 1/2015 |

\* cited by examiner

Fig. 1

Prior Art

Fig. 2

Prior Art

ADJUSTABLE MAGNETIC BUOYANCY GRAVITY COMPENSATOR

TECHNICAL FIELD

The present invention relates to magnetic gravity compensators used in photolithography and, more particularly, to an adjustable magnetic buoyancy gravity compensator.

BACKGROUND

A photolithography tool is a device for exposing a mask pattern onto a wafer, primarily used in the fabrication of integrated circuits (ICs) and other micro-devices. During the exposure of the mask pattern, the mask and wafer are moved simultaneously relative to a projection system and a projection light beam.

Increasing integration of large-scale IC devices leads to demand for photolithography tools with higher resolutions and smaller critical dimensions. At present, photolithography tools have evolved into combinations of internal and external worlds. In such a photolithography tool, a wafer stage, a mask stage and an illumination system for them are damped as three independent worlds. For a fine-motion module, effective damping of a wafer chuck or a mask chuck is necessary for immunizing it from influences from other system during exposure. Gravity compensators are new apparatuses developed in such a context, which accomplish leveling and focusing of the wafer or mask chuck by use of active or passive damping techniques, thus allowing the fine-motion module to operate as an independent internal world.

Figure 1:
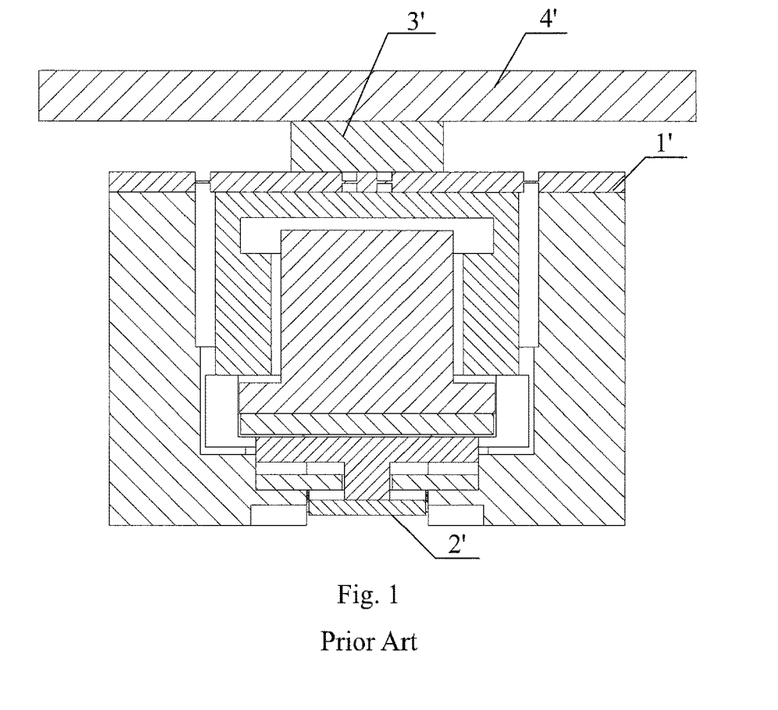
FIG. 1 is a structural schematic of an existing mechanical magnetic gravity compensator.

An existing magnetic gravity compensator is shown in FIG. 1, which employs a mechanical gravity compensation structure having a vertical static gravity compensation module constructed of a leaf spring 1', a movable bottom plate 2' and a tension spring (not shown). The structure additionally has a connection block 3' capable of adjustments in the RX/RY degree of freedom, which damps the fine-motion stage 4' by being connected to it. However, as this solution requires three such magnetic gravity compensators to support the fine-motion stage 4', it is difficult to equally divide the gravitational load among them. The solution also suffers from high structural complexity, high stiffness requirements, low controllability and low accuracy.

Figure 2:
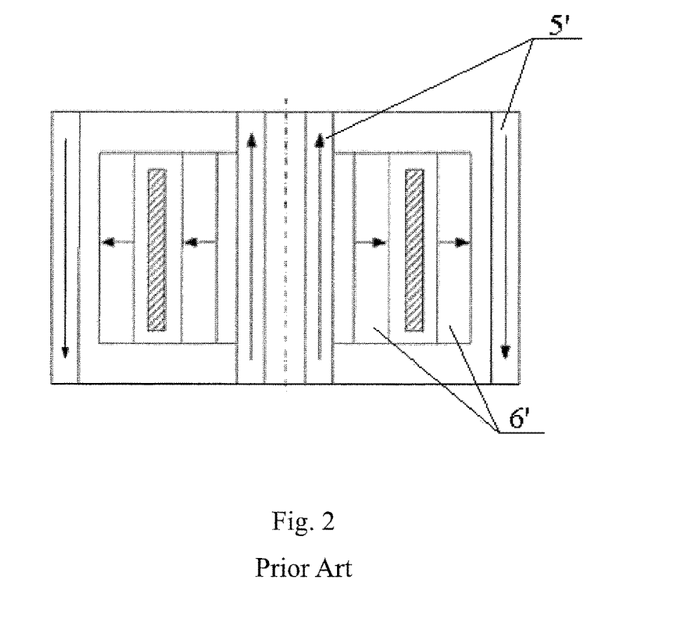
FIG. 2 is a structural schematic of a voice coil motor capable of magnetic gravity compensation.

In order to address these problems, there has been proposed later a voice coil motor, as shown in FIG. 2, which is capable of magnetic gravity compensation. With the motor, a static force is generated between a stator magnet group 5' and a rotor magnet group 6' for balancing the gravity of a motion component. In addition, the powerful voice coil motor is capable of adjustments in the gravity compensation so as to achieve an adjustment of the thrust force. However, this solution is associated with a number of problems such as heavy heat generation and a limited range of adjustment in the compensation provided by the voice coil motor.

SUMMARY OF THE INVENTION

In order to overcome the above-described problems, the present invention presents an adjustable magnetic gravity compensator with significantly reduced heavy heat generation and a wider range of adjustment in gravity compensation.

To achieve this goal, the present invention provides a magnetic gravity compensator, comprising a stator, a rotor, a base and an adjustment mechanism. The stator is disposed on the base, and the rotor is levitated with respect to the stator. The stator comprises a central cylindrical magnet that is fixed to the base by the adjustment mechanism and consists of at least two arc magnets. The adjustment mechanism has a first end fixed to the base and a second end securely connected to the at least two arc magnets. The adjustment mechanism is configured to drive the at least two arc magnets to synchronously move radially with respect to a central axis of the central cylindrical magnet so as to change a magnetic circuit between the central cylindrical magnet and the rotor, and thereby adjust a magnetic levitation force between the stator and the rotor.

Additionally, the rotor may comprise an inner magnet ring and an outer magnet ring, wherein the stator further comprises a coil of a voice coil motor, and wherein the central cylindrical magnet, the inner magnet ring, the coil of the voice coil motor and the outer magnet ring are disposed concentrically, from innermost to outermost.

Additionally, the inner magnet ring and the outer magnet ring may be fixed by a rotor frame.

Additionally, the coil of the voice coil motor may be secured to the base by a coil frame.

Additionally, the adjustment mechanism may comprise a driver, at least two followers connected to the driver and an adjuster, the driver connected to the base, wherein the at least two followers fixedly connected to the at least two arc magnets, and wherein the adjuster is configured to actuate the driver to adjust positions of the at least two followers and the at least two arc magnets.

Additionally, a number of the at least two followers may correspond to a number of the at least two arc magnets.

Additionally, the driver may be a threaded disc with which the at least two followers are threadedly engaged, wherein the adjuster is disposed on the base such that the threaded disc rotates with the adjuster, thereby causing the at least two followers and the at least two arc magnets to synchronously move radially with respect to the central axis of the central cylindrical magnet.

Additionally, the driver may be a frustum, wherein the at least two followers are wedge-shaped blocks corresponding to the frustum, and wherein the adjuster is disposed on the base such that rotation of the adjuster causes the frustum to move vertically and hence causes the at least two followers and the at least two arc magnets to synchronously move radially with respect to the central axis of the central cylindrical magnet.

Additionally, the driver may be a cylindrical base with a central protrusion, wherein the at least two followers are slide blocks connected to the driver by movable hinges, and wherein the adjuster comprises an adjusting nut and an screw rod engaged with the adjusting nut, the screw rod disposed inside the cylindrical base with ends thereof connected to the movable hinges and the base, respectively.

Additionally, the central cylindrical magnet may consist of six or eight arc magnets.

Additionally, the central cylindrical magnet may be magnetized along the central axis thereof.

Additionally, each of the at least two arc magnets, the inner magnet ring and the outer magnet ring may be made of NdFeB.

The adjustable magnetic gravity compensator according to the present invention incorporates the adjustment mechanism and the central cylindrical magnet consisting of a number of arc magnets which can move inward and outward concentrically under the driving effect of the adjustment mechanism. In this way, inner and outer radii of the central cylindrical magnet and hence magnetic circuit between the central cylindrical magnet and the rotor can be altered, allow adjustments in a basic levitation force and thus mechanical adjustments in the magnetic gravity compensation provided by the magnetic gravity compensator within a certain range. Further, passive compensation by the gravity compensation in combination with active compensation by the voice coil motor allows the magnetic gravity compensator to have a wider range of adjustment.

In FIGS. 1 and 2, 1' denotes a leaf spring; 2', a movable bottom plate; 3', a connection block; 4', a fine-motion stage; 5', a stator magnet group; and 6', a rotor magnet group.

In FIGS. 3-10, 1 denotes a stator; 11, a central cylindrical magnet; 111, arc magnets; 12, a coil of a voice coil motor; 2, a rotor; 201, an inner magnet ring; 202, an outer magnet ring; 203, a rotor frame; 4, a base; 5, a coil frame; 6, an adjustment mechanism; 601, a driver; 602, a follower; 603, an adjuster; 6031, an adjusting nut; 6032, a screw rod; and 604, movable hinges.

DETAILED DESCRIPTION

The present invention will be described in detail below with reference to the accompanying drawings.

Embodiment 1

Figure 3:
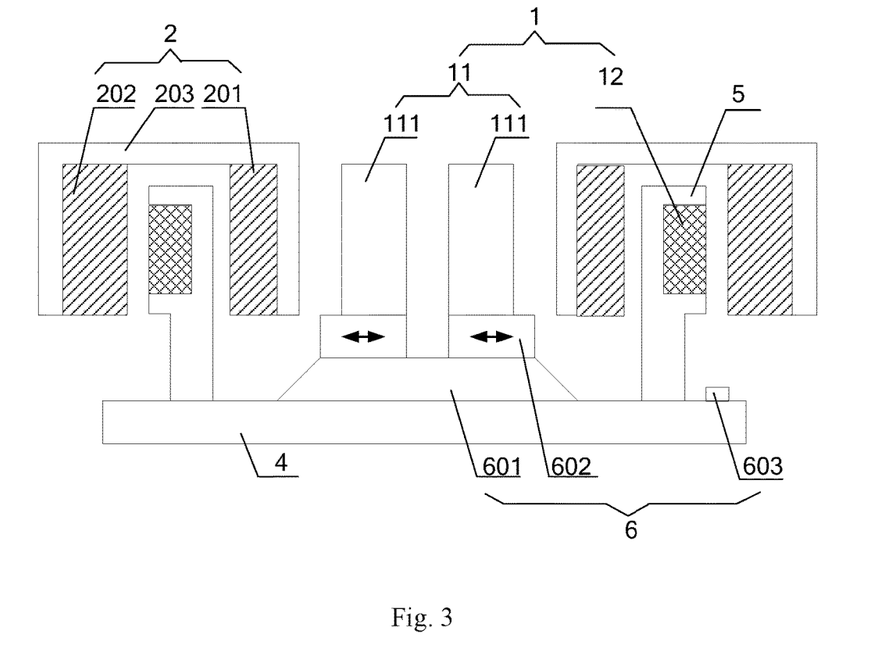
FIG. 3 is a schematic cross sectional view of an adjustable magnetic gravity compensator in accordance with a first embodiment of the present invention.

As shown in FIG. 3, an adjustable magnetic gravity compensator according to this embodiment includes a stator 1, a rotor 2, a base 4 and an adjustment mechanism 6. The stator is disposed on the base 4, and the rotor 2 is magnetically levitated with respect to the stator 1. The stator 1 includes a coil of a voice coil motor 12 and a central cylindrical magnet 11. The coil 12 is fixed to the base 4 by a coil frame 5, and the central cylindrical magnet 11 consists of at least two arc magnets 111 each magnetized along an axis of the central cylindrical magnet 11. The arc magnets cooperate with the rotor 2 to provide a stable and less stiff basic levitation force. The adjustment mechanism 6 is secured to the base 4 at the bottom and is fixedly connected to the arc magnets 111 at the top so that it can drive the arc magnets 111 to move inward and outward concentrically, i.e., radially with respect to a center of the central cylindrical magnet 11. The rotor 2 is magnetized radially. The concentric movement of the arc magnets 111 about the center of the central cylindrical magnet 11 driven by the adjustment mechanism 6 allows changes in the inner and outer radii of the central cylindrical magnet 11 and hence changes in a magnetic circuit between the central cylindrical magnet 11 and the rotor. In this way, the basic levitation force is adjustable, enabling mechanical adjustments in the magnetic gravity compensation of the magnetic gravity compensator in a certain range. Passive compensation by the levitation force in combination with active compensation by the voice coil motor allows the magnetic gravity compensator to have a wider range of adjustment.

Figure 4:
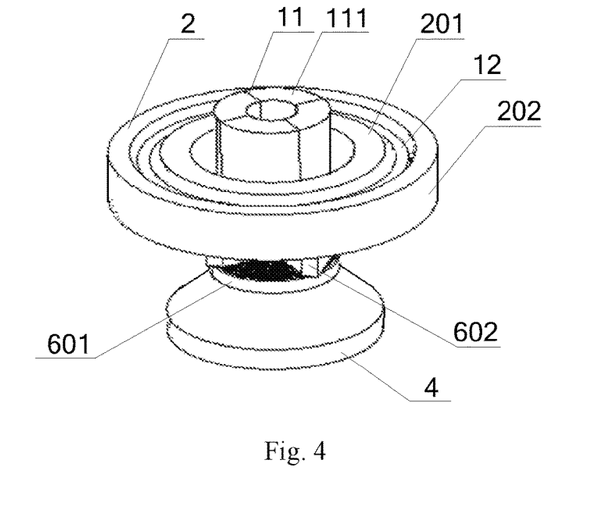
FIG. 4 is a structural schematic of the adjustable magnetic gravity compensator in accordance with the first embodiment of the present invention.

Preferably, the rotor 2 includes an inner magnet ring 201 and an outer magnet ring 202. As shown in FIG. 4, the central cylindrical magnet 11, the inner magnet ring 201, the coil 12 of the voice coil motor and the outer magnet ring 202 are arranged concentrically, from innermost to outermost. The arc magnets 111, the inner magnet ring 201 and the outer magnet ring 202 are all NdFeB magnets. The inner magnet ring 201 and the outer magnet ring 202 are fixed by a rotor frame 203 that has an inverted U-shaped cross section. The inner magnet ring 201 and the outer magnet ring 202 respectively cooperate with the central cylindrical magnet 11 to provide a stable and less stiff basic levitation force. At the same time, a stable radial magnetic field is generated between the inner magnet ring 201 and the outer magnet ring 202. Under the effect of the magnetic field, the coil 12 produces a Lorentz force that offers active damping and gravity compensation effects.

Figure 5A:
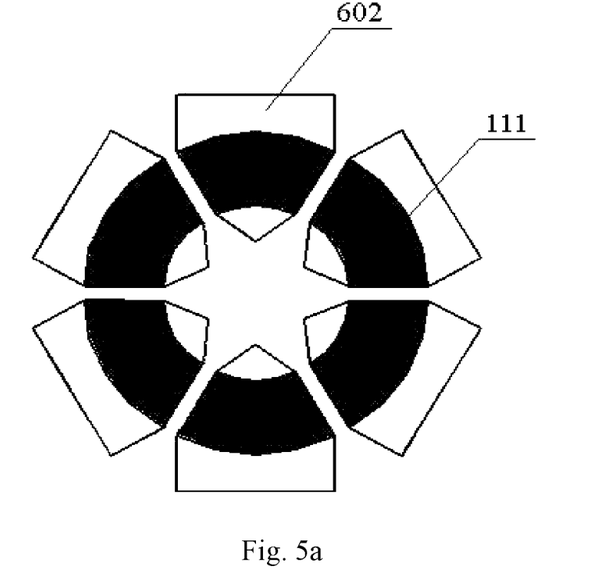
FIGS. 5a and 5b are structural schematics of arc magnets and followers in accordance with the first embodiment of the present invention.
Figure 5B:
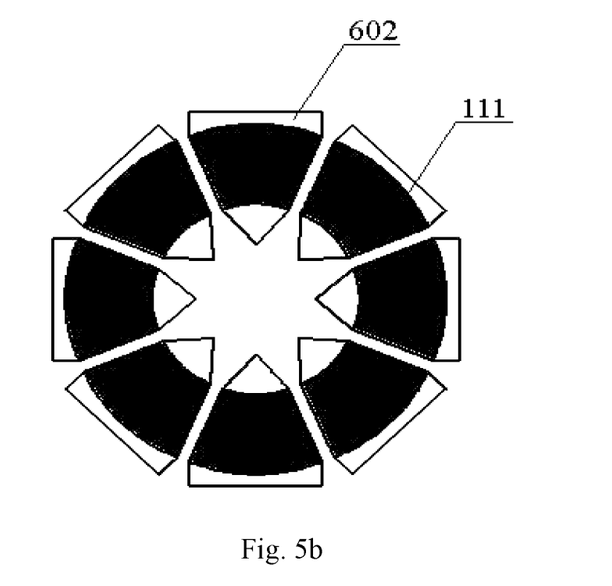

With continued reference to FIG. 3, the adjustment mechanism 6 includes a driver 601, a number of followers 602 in connection with the driver 601 and an adjuster 603. The driver 601 is attached to the base 4 at the bottom, with the followers 602 in fixed connection with the arc magnets 111. The adjuster 603 makes the driver 601 adjust the positions of the followers 602 and the magnets 111. The number of the followers 602 corresponds to that of the arc magnets 111. In order to form a good axially-magnetized cylindrical magnetic field resulting in a low horizontal parasitic tensile stiffness during the concentric inward-and-outward movement of the arc magnets 111, the number of the arc magnets 111 is as many as applicable. As shown in FIGS. 5a and 5b, six or eight arc magnets 111 may be used.

Figure 6:
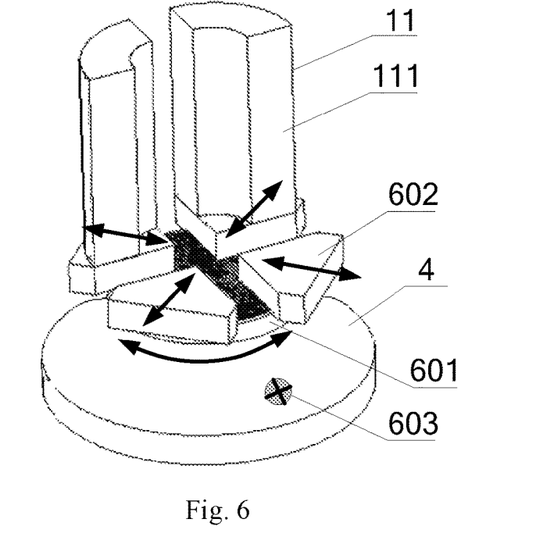
FIG. 6 is a structural schematic of an adjustment mechanism in accordance with the first embodiment of the present invention.

As shown in FIG. 6, the driver 601 is a threaded disc which threadedly engages the followers 602. The adjuster 603 is disposed on the base 4 and connected to the threaded disc. The threaded disc rotates with the adjuster 603, making the followers 602 and the arc magnets 111 concentrically move inward and outward. Specifically, the threaded disc is connected to a transmission mechanism (not shown) within the base 4, and the adjuster 603 may be rotated by a wrench or a screwdriver. The rotation may be transmitted to the threaded disc by the transmission mechanism. Since the followers 602 are threadedly engaged with the threaded disc, the rotation of the threaded disc causes the followers 602 and the arc magnets 111 provided thereon to move inward and outward concentrically, thereby altering the inner and outer radii of the central cylindrical magnet 11 as well as the basic levitation force.

Figure 7A:
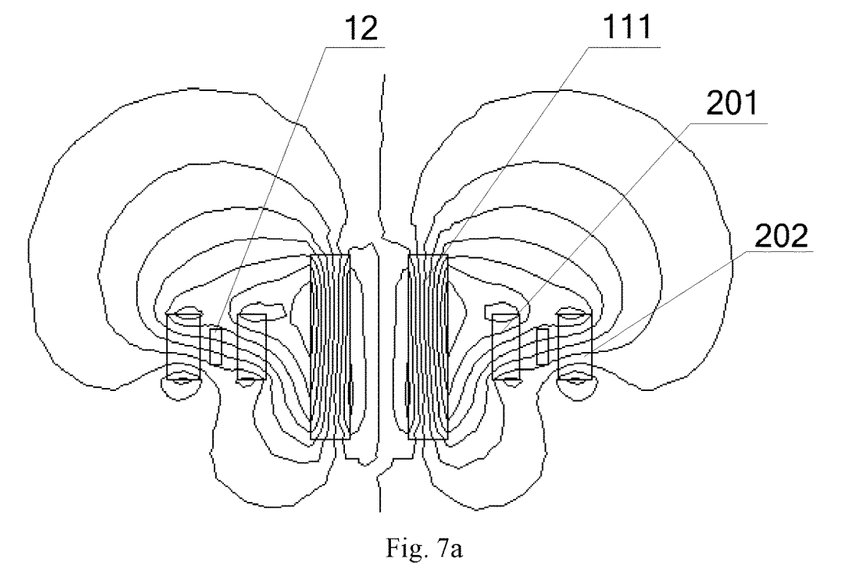
FIGS. 7a and 7b show changes in magnetic lines between the arc magnets and inner and outer magnet rings in accordance with the first embodiment of the present invention.
Figure 7B:
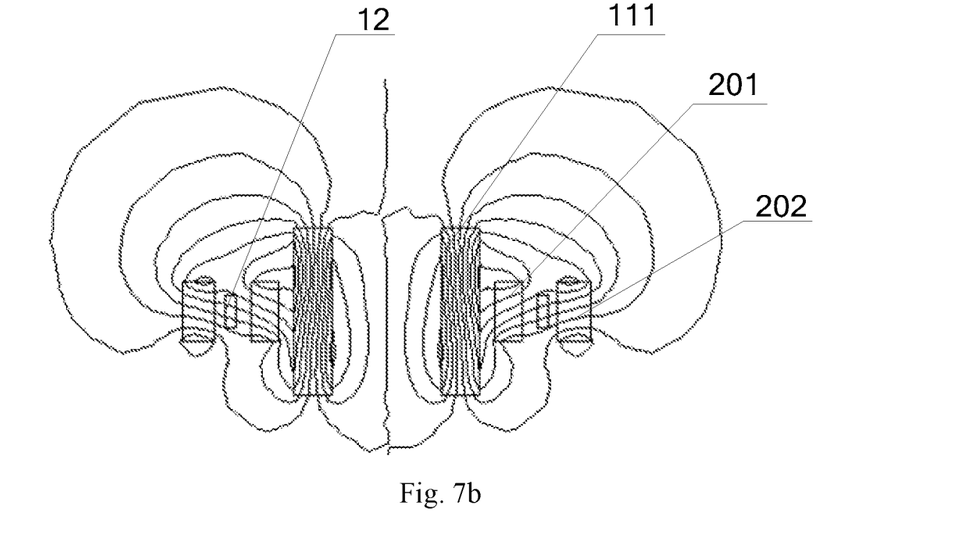

During the concentric inward-and-outward movement of the arc magnets 111, a magnetic circuit among the arc magnets 111, the inner magnet ring 201 and the outer magnet ring 202 in the magnetic gravity compensator changes in structure, and the changes in magnetic lines are as shown in FIGS. 7a and 7b. When the arc magnets 111 move toward the inner and outer magnet rings 201, 202, i.e., when the inner and outer radii of the central cylindrical magnet 11 expand, the part of the magnetic circuit between the central cylindrical magnet 11 and the inner and outer magnet rings 201, 202 is shortened, resulting in an increased axial levitation force, and vice versa.

Figure 8:
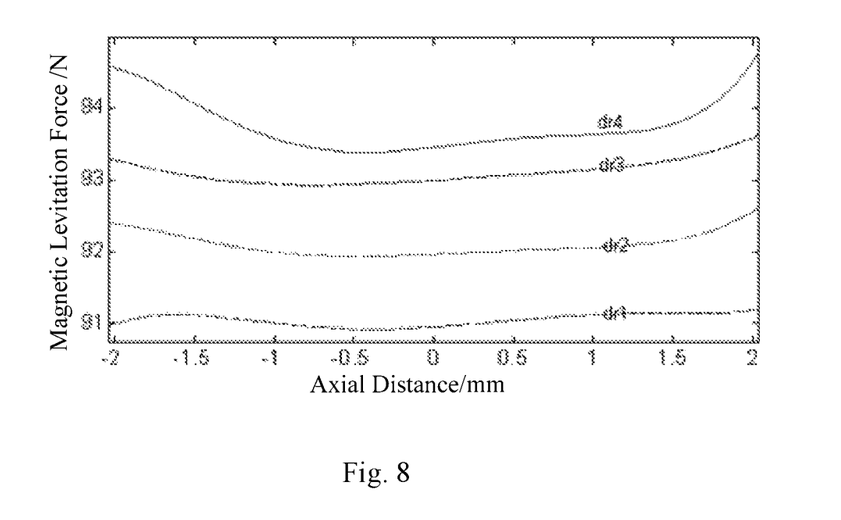
FIG. 8 is a diagram illustrating evolution of a basic levitation force acting on the inner and outer magnet rings in accordance with the first embodiment of the present invention.

FIG. 8 shows a relationship between the basic levitation force acting on the inner and outer magnet rings 201, 202 and the axial movement of the inner and outer magnet rings within a range of −2 mm to 2 mm when the arc magnets 111 simultaneously move outward for a distance within a range of 2 mm. In the figure, dr1, dr2, dr3 and dr4 indicate distances that the arc magnets 111 move. As can be seen from the figure, the basic levitation force acting on the inner and outer magnet rings 201, 202 changes with the different distances of movement of the arc magnets 111 when the inner and outer magnet rings 201, 202 move axially within a range of −2 mm to 2 mm. Therefore, the adjustment capabilities of the adjustment mechanism 6 allow passive magnetic gravity compensation by the levitation force.

Embodiment 2

Figure 9:
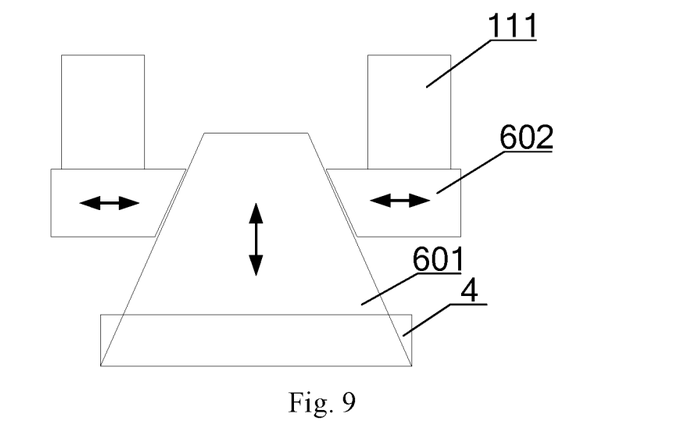
FIG. 9 is a structural schematic of an adjustment mechanism in accordance with a second embodiment of the present invention.

As shown in FIG. 9, this embodiment differs from Embodiment 1 in that, in the adjustment mechanism 6 according to this embodiment, the driver 601 is a frustum, with the followers 602 being wedge-shaped blocks corresponding to the frustum. The adjuster 603 is disposed on the base 4, and when it is rotated, the frustum is caused to move upward or downward, driving the followers 602 and the arc magnets 111 to move inward and outward concentrically. The close fit between the frustum and the wedges allows a higher adjustment accuracy.

Embodiment 3

Figure 10:
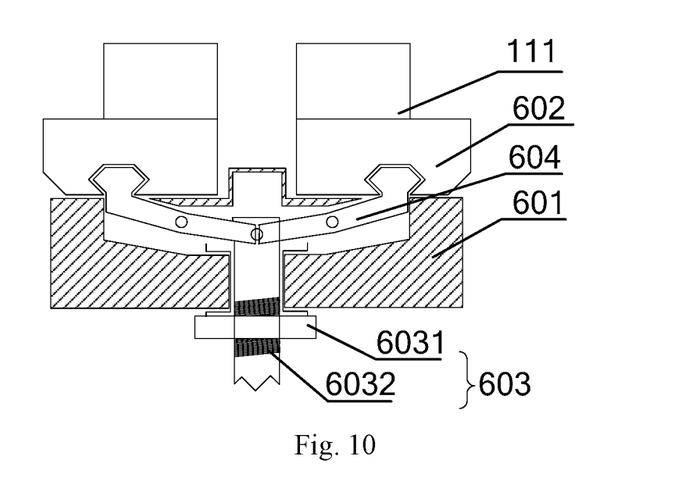
FIG. 10 is a structural schematic of an adjustment mechanism in accordance with a third embodiment of the present invention.

As shown in FIG. 10, this embodiment differs from Embodiments 1 and 2 in that, in the adjustment mechanism 6 according to this embodiment, the driver 601 is a cylindrical base with a central protrusion while the followers 602 are slide blocks. They are articulated together with movable hinges 604. The adjuster 603 includes an adjusting nut 6031 and a screw rod 6032 engaged with the adjusting nut 6031. The screw rod 6032 is provided inside the cylindrical base and is connected to the movable hinges 604 and the base 4 at the top and bottom, respectively. The engagement between the adjusting nut 6031 and the screw rod 6032 allows a higher adjustment flexibility.

While embodiments of the present invention have been described herein, these embodiments are merely illustrative and should not be construed as limiting the scope of the invention in any sense. It is intended that all omissions, substitutions, and alterations made without departing from the spirit of the invention fall within the scope thereof.

What is claimed is:

1. A magnetic gravity compensator, comprising a stator, a rotor, a base and an adjustment mechanism, the stator disposed on the base, the rotor levitated with respect to the stator, wherein the stator comprises a central cylindrical magnet that is coupled to the base by the adjustment mechanism and consists of at least two arc magnets, the adjustment mechanism configured to drive the at least two arc magnets to synchronously move radially with respect to a central axis of the central cylindrical magnet so as to change a magnetic circuit between the central cylindrical magnet and the rotor, and thereby adjust a magnetic levitation force between the stator and the rotor;

wherein the adjustment mechanism comprises a driver, at least two followers connected to the driver and an adjuster, the driver connected to the base, the at least two followers in fixed connection with the at least two arc magnets, the adjuster configured to actuate the driver to adjust radial positions of the at least two followers and the at least two arc magnets with respect to the central axis of the central cylindrical magnet.

2. The magnetic gravity compensator according to claim 1, wherein the rotor comprises an inner magnet ring and an outer magnet ring, wherein the stator further comprises a coil of a voice coil motor, and wherein the central cylindrical magnet, the inner magnet ring, the coil of the voice coil motor and the outer magnet ring are disposed concentrically, from innermost to outermost.

3. The magnetic gravity compensator according to claim 2, wherein the inner magnet ring and the outer magnet ring are fixed by a rotor frame.

4. The magnetic gravity compensator according to claim 2, wherein the coil of the voice coil motor is secured to the base by a coil frame.

5. The magnetic gravity compensator according to claim 1, wherein a number of the at least two followers corresponds to a number of the at least two arc magnets.

6. The magnetic gravity compensator according to claim 1, wherein the driver is a threaded disc with which the at least two followers are threadedly engaged, and wherein the adjuster is disposed on the base such that the threaded disc rotates with the adjuster, thereby causing the at least two followers and the at least two arc magnets to synchronously move radially with respect to the central axis of the central cylindrical magnet.

7. The magnetic gravity compensator according to claim 1, wherein the driver is a frustum and the at least two followers are wedge-shaped blocks corresponding to the frustum, and wherein the adjuster is disposed on the base such that rotation of the adjuster causes the frustum to move vertically and causes the at least two followers and the at least two arc magnets to synchronously move radially with respect to the central axis of the central cylindrical magnet.

8. The magnetic gravity compensator according to claim 1, wherein the driver is a cylindrical base with a central protrusion and the at least two followers are slide blocks connected to the driver by movable hinges, and wherein the adjuster comprises an adjusting nut and an screw rod engaged with the adjusting nut, the screw rod disposed inside the cylindrical base with ends thereof connected to the movable hinges and the base, respectively.

9. The magnetic gravity compensator according to claim 1, wherein the central cylindrical magnet consists of six or eight arc magnets.

10. The magnetic gravity compensator according to claim 1, wherein the central cylindrical magnet is magnetized along the central axis thereof.

11. The magnetic gravity compensator according to claim 2, wherein each of the at least two arc magnets, the inner magnet ring and the outer magnet ring is made of NdFeB.

\* \* \* \* \*